United States Patent
Pedersen et al.

(10) Patent No.: US 8,497,741 B2
(45) Date of Patent: Jul. 30, 2013

(54) HIGH ACCURACY RC OSCILLATOR

(75) Inventors: Frode Milch Pedersen, Trondheim (NO); Kristoffer Ellersgaard Koch, Trondheim (NO); Ronan Barzic, Tiller (NO); Erwin Dotzauer, Roggenburg (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/271,676

(22) Filed: Oct. 12, 2011

(65) Prior Publication Data

US 2013/0093522 A1    Apr. 18, 2013

(51) Int. Cl.
*H03L 1/00* (2006.01)
(52) U.S. Cl.
USPC ............. 331/176; 331/34; 331/36 C; 331/143
(58) Field of Classification Search
USPC .................................. 331/34, 36 C, 143, 176
See application file for complete search history.

(56) References Cited

U.S. PATENT DOCUMENTS

| | | | |
|---|---|---|---|
| 6,342,798 B1 * | 1/2002 | Yoshida | 327/156 |
| 6,677,788 B2 * | 1/2004 | Miyagawa et al. | 327/156 |
| 7,612,624 B2 * | 11/2009 | Lim et al. | 331/143 |
| 2007/0176690 A1 * | 8/2007 | Sutardja | 331/8 |
| 2007/0241833 A1 * | 10/2007 | Nervegna | 331/176 |
| 2011/0048349 A1 * | 3/2011 | Miura | 123/90.15 |
| 2011/0210797 A1 * | 9/2011 | Quevy et al. | 331/48 |

OTHER PUBLICATIONS

ATMEL Corporation, "8-bit AVR® XMEGA™ A Microcontroller," XMEGA A Manual, 445 pages (Dec. 2009).

* cited by examiner

*Primary Examiner* — Joseph Chang
*Assistant Examiner* — Jeffrey Shin
(74) *Attorney, Agent, or Firm* — Fish & Richardson P.C.

(57) ABSTRACT

A device includes an RC oscillator circuit and incorporates various features that individually and in combination can help improve the stability or accuracy of the oscillator output frequency. The oscillator circuit is operable to provide a tunable output frequency and includes a bias circuit switchable between first and second modes of operation. One of the modes has less drift in oscillator bias current relative to the other mode. The device also includes drift compensation circuitry that is operable to compensate for drift in the oscillator output frequency in a closed-loop mode of operation based on a comparison of the oscillator output frequency with a reference frequency. The device further includes a processor operable to compensate for temperature-based drift in the oscillator frequency in an open-loop mode of operation based on a measured temperature value in the vicinity of the oscillator circuit.

22 Claims, 6 Drawing Sheets

| FCD | REF | MODE | EN1K | EN32K | EN64K | ENTC | EN |
|---|---|---|---|---|---|---|---|

70

- FCD: Flash calibration done
    Signifies that COARSE value in the register 24 has been loaded with value from fuses.
    0: Fuses not loaded. Calibration value will be loaded on reset.
    1: Fuses loaded. Calibration value will maintain its current value on reset.

- REF: Reference select
    Selects the reference clock for the closed-loop mode.
    0: The 32 kHz frequency signal is selected as the reference.
    1: Generic clock is selected as the reference.

- MODE: Mode Selection
    0: Operates in open-loop mode.
    1: Operates in closed-loop mode.

- EN1K: Enable 1 kHz output
    0: 1 kHz oscillator output is disabled.
    1: 1 kHz oscillator output is enabled.

- EN32K: Enable 32 KHz output
    0: 32 kHz oscillator output is disabled.
    1: 32 kHz oscillator output is enabled.

- EN64K: Enable 64 KHz output
    0: 64 kHz oscillator output is disabled.

1: 64 kHz oscillator output is enabled.

- ENTC: Temperature Compensation Enable
    0: The oscillator is not temperature compensated.
    1: The oscillator is temperature compensated.

- EN: Enable as Generic clock source
    0: The oscillator is not enabled as a generic clock source.
    1: The oscillator is enabled as a generic clock source.

FIG. 7

HIGH ACCURACY RC OSCILLATOR

BACKGROUND

This disclosure relates to high accuracy RC oscillators.

Oscillators are the primary clock sources, for example, in microcontrollers and other integrated circuits. The number of oscillators can be increased to obtain the required frequencies, for example, by means of phase locked loops. The clock accuracy, however, is limited by the oscillator source.

Internal RC oscillators are attractive for microcontroller and other applications because of their relatively low cost. They can be highly integrated with other on-chip components and generally require no external components. However, the accuracy of RC oscillators usually does not exceed a few percent, which limits their use to non-critical clocks.

Many applications with accurate clock requirements incorporate a highly accurate crystal oscillator. To incorporate the crystal oscillator, such applications typically require multiple input/output pins and external components. Although such requirements are undesirable in microcontroller and other applications due to space and cost constraints, suitable alternatives have traditionally been unavailable.

Some applications require clocks with a tolerance better than can be provided by an RC oscillator (i.e., a few percent), but not as accurate as a crystal oscillator (i.e., tens of parts per million (ppm)). For example, a universal serial bus (USB) at full speed may require a clock accuracy of 2500 ppm. A crystal oscillator often is used to meet these clock requirements.

In low power modes, one oscillator can be operated continually to wake up the system at periodic intervals. An ultra-low power (ULP) RC oscillator can be used. However, as such an oscillator typically is highly inaccurate, it only allows the system to wake up at approximate intervals. In view of the relatively poor accuracy of a ULP RC oscillator, it typically is not useful as a reference for frequency multipliers. For applications in which a ULP RC oscillator is not sufficiently accurate, a 32 kHz crystal oscillator may be used, but further increases the cost of the system.

SUMMARY

In one aspect of the invention, a device includes an RC oscillator circuit and incorporates various features that individually and in combination can be enabled to improve the stability or accuracy of the oscillator output frequency. The oscillator circuit is operable to provide a tunable output frequency and includes a bias circuit switchable between first and second modes of operation. One of the modes has less drift in oscillator bias current relative to the other mode. The device also includes drift compensation circuitry that is operable to compensate for drift in the oscillator output frequency in a closed-loop mode of operation based on a comparison of the oscillator output frequency with a reference frequency. The device further includes a processor operable to compensate for temperature-based drift in the oscillator frequency in an open-loop mode of operation based on a measured temperature value in the vicinity of the oscillator circuit.

In another aspect, a method of operating an RC oscillator circuit that provides a tunable output frequency is described. The method includes providing a signal to the oscillator circuit to cause a bias circuit for the oscillator circuit to switch between first and second modes of operation, one of which has less drift in oscillator bias current relative to the other mode. A mode selection signal is generated to enable one of the following modes of operation: a closed-loop mode of operation based to compensate for drift in the oscillator output frequency based on a comparison of the oscillator output frequency with a reference frequency or an open-loop mode of operation to compensate for temperature-based drift in the oscillator frequency based on a measured temperature value in a vicinity of the oscillator circuit.

A further aspect relates to operating an RC oscillator circuit that provides a tunable output frequency. According to this aspect, an output frequency of the oscillator circuit is compared with a reference frequency, and an input value for a tunable resistor in the oscillator circuit is adjusted based on the comparison. This aspect includes detecting that the input value for the tunable resistor corresponds to a highest or lowest value within a specified range of possible values and generating an error signal if the highest or lowest value is detected.

Some implementations include one or more of the following advantages. The disclosed device can combine factory calibration, run-time calibration, and temperature compensation to overcome traditional drawbacks of low-power RC oscillators. This allows the oscillator to replace the use of 32 kHz crystal operation in some applications, as well as replacing the need for any crystal oscillator as a clock reference in various applications. The design can be implemented with very little cost overhead compared to a traditional ULP RC oscillator, and can provide, in some cases, sufficiently high accuracy as to eliminate the need for a secondary RC oscillator to be used to generate other clocks in the system.

Other aspects, features and advantages will be readily apparent from the following detailed description, the accompanying drawings, and the claims.

BRIEF DESCRIPTION OF THE DRAWINGS

FIG. 7 illustrates an example of a control register that stores information associated with operation of the oscillator.

DETAILED DESCRIPTION

Figure 1:
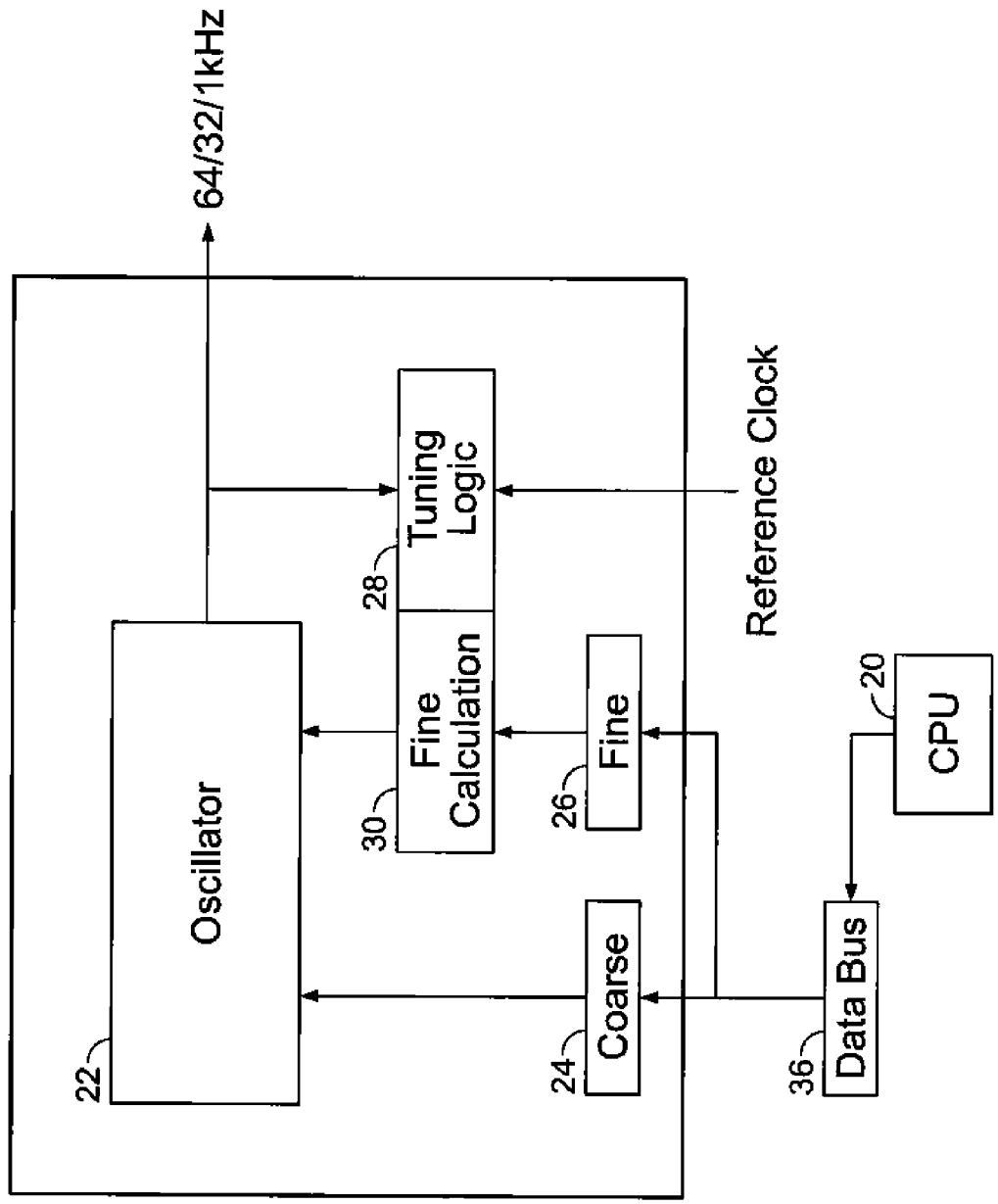
FIG. 1 is a block diagram illustrating an example of a device including an RC oscillator circuit according to the invention.

As illustrated in the example of FIG. 1, a device such as a microcontroller includes a central processing unit (CPU) 20 and an RC oscillator core 22 with associated circuitry. The oscillator core 22 provides a tunable, low speed, low-power clock source. Information stored in non-volatile memory (e.g., a pair of registers 24, 26) can be used to set the nominal frequency values of the RC oscillator. In addition, the device incorporates one or more features that can improve the stability and accuracy of the RC oscillator. These features, which are explained in greater detail below, include a switchable on-chip bias circuit that can be enabled to operate in a temperature compensation mode to reduce drift in the oscillator bias current. Temperature-based drift also can be compensated for in a closed-loop mode using hardware logic, shown in FIG. 1 as tuning circuitry 28 and fine calculation circuitry 30. In addition, temperature-based drift can be compensated for in an open-loop mode using a software program executed by the CPU 20 that dynamically adjusts a value stored in the register 26 based, at least in part, on a measured temperature value. In the illustrated implementation, any of the foregoing techniques can be enabled to provide greater flexibility. However, in some cases, fewer than all the techniques may be implemented. The CPU 20 may be coupled to the registers 24, 26, for example, by way of a data bus 36.

Figure 2:
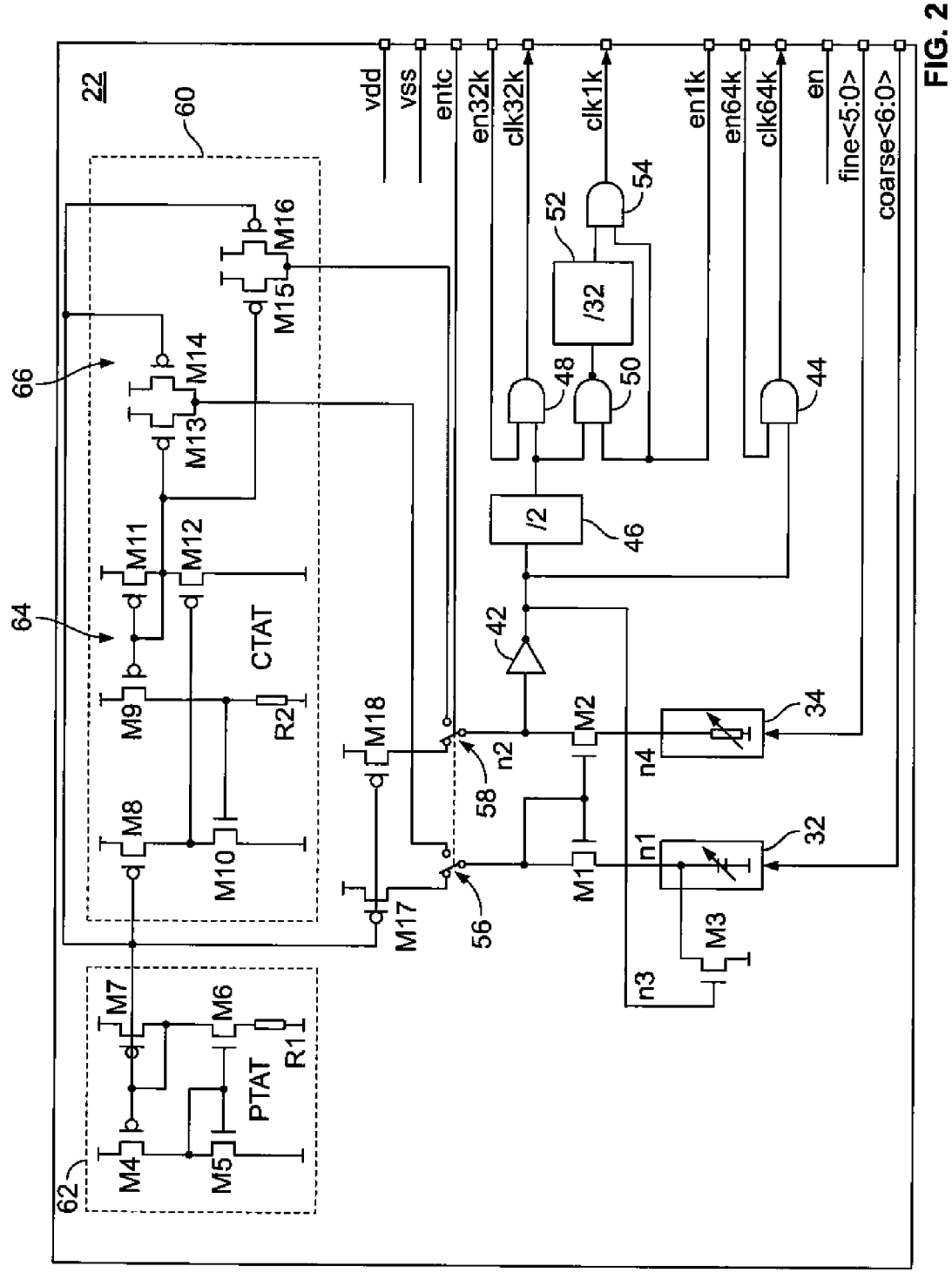
FIG. 2 illustrates further details of the RC oscillator circuit.

As illustrated in FIG. 2, the components of the RC oscillator core 22 can be implemented in a single integrated circuit chip and include a tunable capacitor 32 and a tunable resistor 34. The values of the capacitance and resistance, which are tunable independently of one another, determine the oscillation frequency, subject to small variations due, for example, to changes in temperature. For example, increasing the capacitance reduces the oscillation frequency, and increasing the resistance also reduces the oscillation frequency. The circuitry also includes a reset switch M3 for resetting the capacitor 32, and a diode M1 and switch transistor M2, which function as a comparator. The RC oscillator core 22 includes a bias circuit 60 coupled to the capacitor 32 and resistor 34 through switches 56, 58. The nominal oscillation frequency (in this example, 64 kHz) appears at the output of an inverter 42.

In the illustrated example, the possible values for the capacitor 32 are divided into seven binary steps, which can be enabled with a multi-bit vector (i.e., "COARSE") to compensate for process variations. Likewise, in the illustrated example, the possible values for the resistor 34 are divided into six binary steps, which can be enabled with another multi-bit vector ("FINE"). These vectors provide coarse and fine tuning for the oscillator frequency. Although it is possible to specify the signals for the capacitor and resistor values in a single vector, using two separate vectors can result in lower cost. In this case, the dimensions of the capacitor 32 and resistor 34 can be selected so that the oscillator can be tuned to an accuracy of approximately 1000 ppm, making the design usable as clock reference for a wide range of purposes. Similarly, the tuning range of the resistor 34 can be sufficiently wide to compensate for any expected temperature variation in the oscillator.

Upon power-up of the device, previously stored values for the COARSE and FINE vectors are read from the registers 24, 26. In the illustrated example, the COARSE value typically remains fixed during operation. If the FINE value remains fixed as well, then the oscillator frequency will tend to drift slightly with changes in temperature. As explained below, one or more techniques for oscillator temperature compensation can be enabled to reduce this drift.

Initial values of the COARSE and FINE vectors can be established, for example, during production testing. In some implementations, during production testing, the 32 kHz output signal ("clk32k") from the RC oscillator core 22 is compared to an accurate 32 kHz clock signal. The COARSE value then is adjusted until the output is as close to 32 kHz as possible. The FINE value also can be tuned to achieve further accuracy. If the production test is performed at multiple different temperatures, the FINE value can be recalibrated for the second temperature. This additional value also can be stored in the non-volatile memory. At a later time, the COARSE value can be overridden, if desired, by a user by causing an updated value to be written to the register 24. Also, as explained below, the FINE value can be tuned in either a closed-loop mode or an open-loop mode. Although FIG. 1 shows two different registers 24, 26 for storing, respectively, the COARSE and FINE values, in some implementations, both values can be stored in a single register.

During operation of the RC oscillator core 22, oscillation occurs as follows. Initially, node n1 is discharged, causing switch M2 to be turned off. As a result, the voltage at node n2 is higher than the threshold voltage of the inverter 42, and the voltage at node n3 is 0 volts (V). Next, a bias current through switch M1 charges the capacitor 32, which causes the voltage at node n1 to rise linearly until the threshold voltage of switch M2 is reached. Then, switch M2 turns on, and bias current flows through the switch M2. The voltage at node n4 increases (although it is below the threshold voltage of the inverter 42), and the voltage at node n2 decreases until the threshold voltage of the inverter 42 is reached. Then, the inverter 42 drives a high level on node n3, which causes the switch M3 to discharge node n1.

Although the nominal oscillation frequency at the output of the inverter 42 is 64 kHz, alternative clock outputs of 32 kHz and 1 kHz can be provided for flexibility and low power use. For example, to allow an accurate duty cycle clock, the 64 kHz signal can be divided by two to provide a 32 kHz output signal. This output signal is the nominal clock output of the RC oscillator core 22 and can be used, for example, instead of the output of a 32 kHz crystal oscillator located elsewhere in the system. To save power in external clock nets, the output can be further divided by 32 to produce a 1 kHz output signal. The RC oscillator core 22 includes frequency dividers 46, 52 and logic gates 44, 48, 50, 54 to provide the foregoing outputs (i.e., clk64k, clk32k, clk1k). Each of these outputs can be enabled independently by corresponding enable signals (i.e., en64k, en32k, en1k). By integrating the frequency divider 52 into the RC oscillator core chip, overall power consumption can be reduced. Furthermore, by enabling the logic gates 44, 48, 50, 54 only as needed, overall power consumption can be reduced further. The core oscillator 22 can be enabled as a 32 kHz generic clock source based on an enable signal ("en"). A control register 70 stores values that control the foregoing enable signals as well as other control signals. In some implementations, the control register has thirty-two bits. A portion of such a register, and the information it stores, is illustrated in FIG. 7.

In the illustrated example, the bias circuit 60 includes both a proportional-to-absolute-temperature (PTAT) branch 62 and a complementary-to-absolute-temperature (CTAT) branch 64. The PTAT branch 62 includes transistors M4, M5, M6, M7 and an integrated resistor R1. The CTAT branch 64 includes transistors M8, M9, M10, M11, M12 and an integrated resistor R2.

The PTAT circuit 62 draws relatively low current and, therefore, can be used advantageously for low power modes of operation. The PTAT circuit 62, however, typically is temperature dependent. In contrast, the combination of the PTAT and CTAT circuits 62, 64 is much less temperature dependent and, therefore, can be used for applications requiring a more accurate temperature-compensated mode of operation. As explained below, the RC oscillator core 22 is switchable between a first low power mode and a second temperature compensated mode. In the latter mode, the oscillator current bias is temperature-compensated to reduce drift. The temperature compensation, however, may come at the expense of slightly higher current consumption.

As illustrated in the example of FIG. 2, an output of the PTAT circuit 62 is coupled to transistors M17, M18, which in turn, are coupled, respectively, to the switches 56, 58 when the oscillator core 22 is operated in the non-temperature compensated mode. Thus, in the non-temperature compensated mode of operation, the switches 56, 58 are in the positions as shown in FIG. 2. In addition, the outputs of both the PTAT and CTAT circuits 62, 64 are coupled to a summation circuit 66, which includes transistors M13, M14, M15, M16 that function as current sources. Outputs of the summation circuit 66 are coupled, respectively, to the switches 56, 58 when the oscillator core 22 is operated in the temperature compensated mode. Thus, in the temperature compensated mode of operation, the switches 56, 58 move to their alternative positions from what is shown in FIG. 2. The positions of the switches are controlled by an "enable temperature compensation" signal (entc). The value of the entc signal is determined by a value stored in the control register 70 (see FIG. 7) and controls whether or not the RC oscillator core 22 operates in the temperature compensated mode. In the illustrated example, when the value of the entc signal is LOW, only the PTAT branch of the bias circuit 60 is enabled (i.e., no temperature compensation). On the other hand, when value of the entc signal value is HIGH, both the PTAT and the CTAT branches are enabled so that the oscillator core operates in the temperature compensated mode. Thus, the RC oscillator core 22 is switchable between the first low power mode (by using only the PTAT bias branch 32) and the second temperature compensated mode (by using both the PTAT and CTAT bias branches 32, 34). This feature provides greater flexibility by providing different modes of operation that present a tradeoff between higher accuracy and lower power consumption.

The various transistors in the RC oscillator core 22 can be implemented, for example, using MOSFET (e.g., PMOS) technology. However, other types of transistors can be used in some implementations. The RC oscillator core chip also includes various input/output pins for the clock signals (clk64k, clk32k, clk1k), the enable signals (en, en64k, en32k, en1k), the COARSE and FINE control signals, and the operating voltages (vdd and vss).

Even when the switchable on-chip bias circuit is enabled to operate in a temperature compensation mode to reduce drift in the oscillator bias current, there may still be some small amount of temperate-based drift in the oscillator output. In some cases, such drift may be on the order of about 12 Hz/K. To provide additional compensation for the temperature-based drift, the device can incorporate run-time calibration in either a closed-loop mode or an open-loop mode. Whether the device operates in the closed or open-loop mode is determined by a value ("MODE") stored in the control register 70 (see FIG. 7). The open and closed-loop techniques, which are discussed in greater detail below, adjust the FINE vector value used to tune the value of the resistor 34. Also, whereas the on-chip bias circuit is implemented in the illustrated example in analog circuitry, the open and closed-loop techniques can be implemented digitally.

Figure 3:
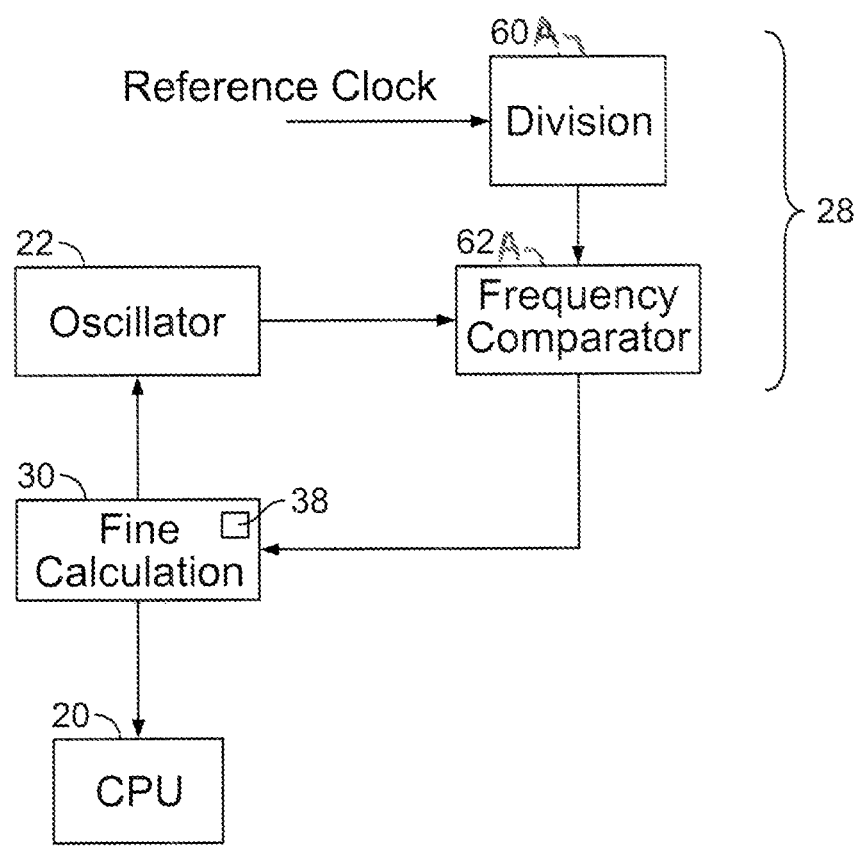
FIG. 3 illustrates an example of circuitry for a closed-loop mode of operation for temperature compensation of the oscillator frequency.

In the closed-loop mode, the tuning circuitry 28 dynamically tunes the value of the FINE vector until the oscillator output matches a specified reference frequency. This frequency can be, for example, a divided clock signal obtained from a high-frequency crystal oscillator, or from some other external signal of known frequency. As shown in FIG. 3, a highly accurate, high frequency reference clock is provided to a clock divider 60A, which divides the reference clock signal to generate a signal having the specified reference frequency (e.g., 32 kHz). A comparator 62A compares the reference frequency from the frequency divider 60A with the output signal (e.g., clk32k) from the RC oscillator core 22. The frequency comparator 62A generates a signal indicating whether the current FINE value is too high or too low, based on the frequency of the oscillator compared to the reference frequency.

Figure 4:
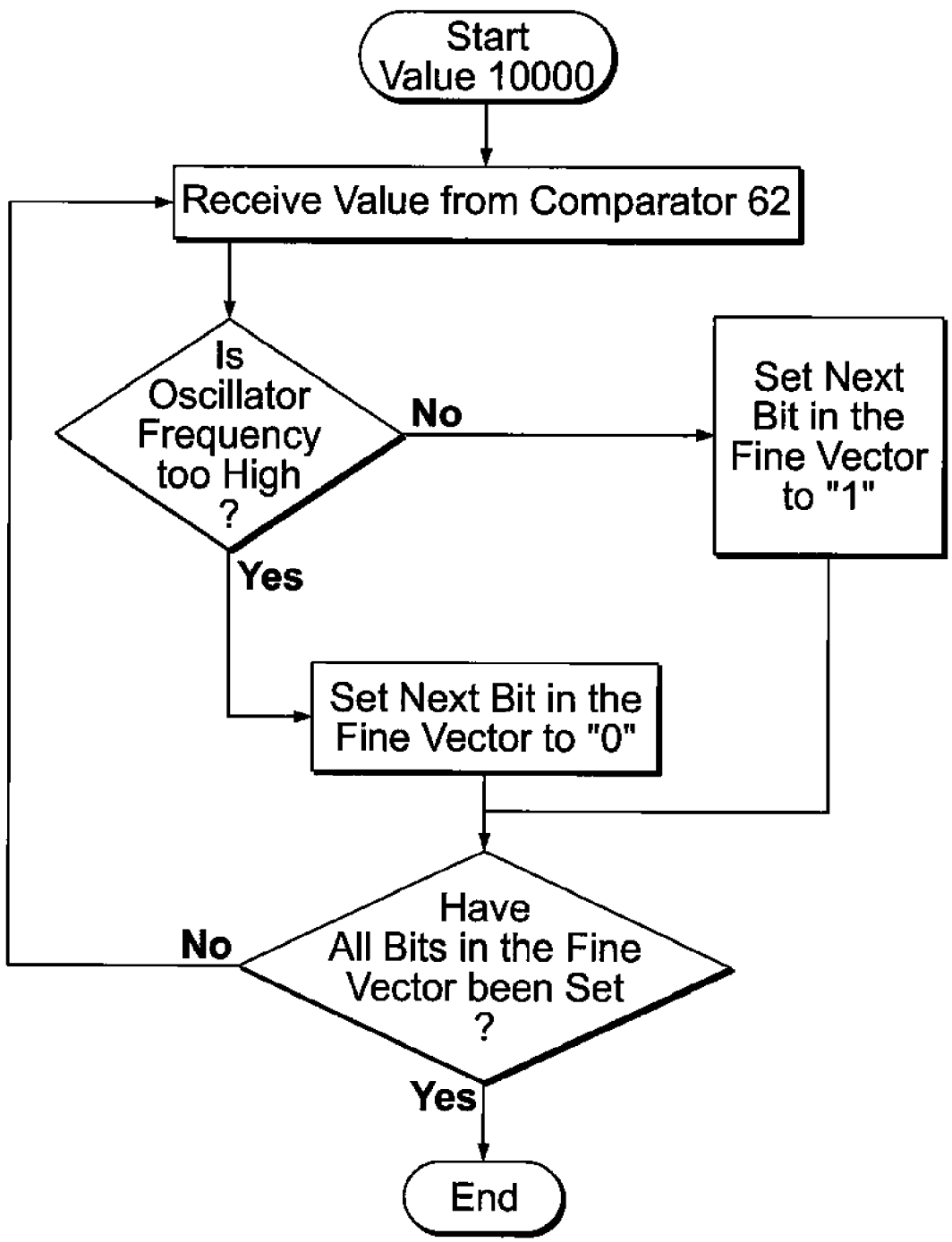
FIG. 4 is a flow chart illustrating an example of an algorithm for adjusting the oscillator frequency.

The fine calculation unit 30 implements an algorithm to determine an optimal FINE value based on the measurement from the frequency comparator 62A. In some implementations, the fine calculation unit 30 applies a refined value and proceeds with the next iteration. As the oscillator 22 can be relatively slow, it is an advantageous to find the correct setting in as few iterations as possible. This can be accomplished, for example, through a binary search in which the fine calculation unit 30 starts with a large step, and then divides the step size by two for each subsequent iteration (see FIG. 4). This implementation also is practical for digital logic implementations because each bit position in the FINE vector corresponds to the next step size. For example, if the correct FINE value to produce precisely 32 kHz is 11011 (binary), the algorithm implemented by the fine calculation unit 30 would be as follows for the illustrated implementation:

Iteration 1: FINE=10000>>>too low
Iteration 2: FINE=11000>>>too low
Iteration 3: FINE=11100>>>too high
Iteration 4: FINE=11010>>>too low
Iteration 5: FINE=11011>>>as close as possible to the correct value Thus, in this case, in only five iterations it is possible to find the optimal value for all five bits of the FINE vector, although the resulting oscillator frequency may be a little too high or too low because of the limited resolution of the FINE vector. Also, it is possible that the optimal FINE value will change over time as a result of temperature drift in the oscillator 22. Preferably, to ensure that the oscillator 22 stays substantially locked to the 32 kHz average frequency, the algorithm executed by the fine calculation circuit 30 alternately adds or subtracts one for subsequent iterations.

The number of bits for the FINE vector can be selected so that temperature drift typically can be compensated for by adjusting the FINE vector only, provided that the COARSE vector already has been calibrated correctly. Sometimes, however, an error may be made in the calibration of the COARSE value, or the temperature may drift outside the specified range for the oscillator. In such instances, the final FINE value determined by the fine calculation unit 30 may be set to either the highest or lowest possible value (e.g., 11111 or 00000). In such cases, it is not possible to compensate for further temperature drift using the closed-loop technique alone. Such a situation indicates that the COARSE vector previously was set to too high or too low. To address such situations, the fine calculation unit 30 can include a saturation error detector 38, which generates an error flag to the CPU 20 if the FINE value is at either extreme. In response, the CPU 20 can adjust the COARSE value (up or down) and trigger a new iteration sequence to set the optimal FINE value. The foregoing features can help increase the robustness and practical usability of the device by allowing error states to be handled.

Figure 5:
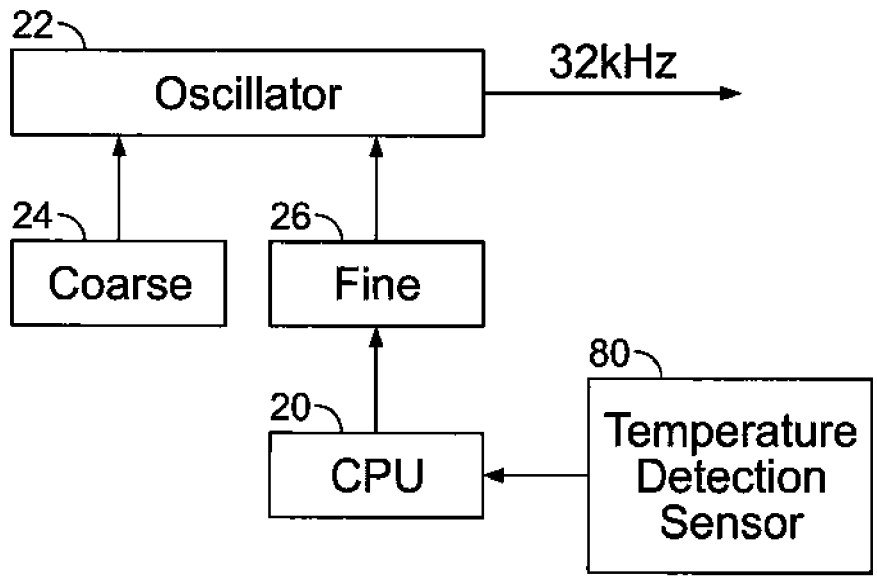
FIG. 5 illustrates an example of circuitry for an open-loop mode of operation for temperature compensation of the oscillator frequency.
Figure 6:
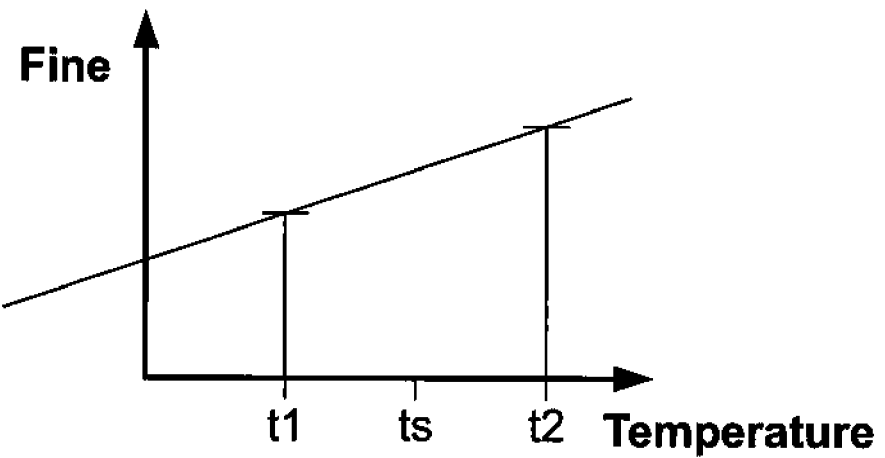
FIG. 6 is an example of a graph of temperature versus a value for adjusting a tunable resistance in the RC oscillator.

FIG. 5 illustrates how temperature-based drift can be compensated for in the open-loop mode using a software program executed by the CPU 20 to adjust the FINE value stored based, at least in part, on a measured temperature value. Software can use open-loop tuning of the FINE vector according to an on-chip temperature measured by a sensor 80 and one or more calibration values stored in non-volatile memory. The sensor 80 can include an analog-to-digital converter (ADC) to convert the measured analog temperature signal to an equivalent digital signal. If previously stored calibration values from two different temperatures are available (see, e.g., FIG. 6: t1, t2), the FINE vector can be determined by the CPU 20 using interpolation based on the measured value (ts) of the on-chip temperature. If one calibration value is available, the value of the FINE vector can be extrapolated by assuming a typical temperature gradient based on the general characterization of the design. The CPU 20 can be coupled to the registers 24, 26 by way of a data bus 36 so that the CPU can change the values stored in the registers.

During low-power operation, the oscillator operates with fixed COARSE and FINE settings. The oscillation frequency is initially highly accurate, which can eliminate the need for a 32 kHz crystal oscillator. If the temperature changes during low-power operation, temperature drift may affect the accuracy of the oscillator 22. If this is not tolerated, an ultra-low power timer can be used to wake the device periodically and start operation of a high-speed crystal oscillator. The tuning logic 28 then can operate in closed-loop mode and automatically adjust the FINE setting to produce an accurate 32 kHz output using the crystal oscillator output as the reference clock. The device then can switch off the crystal oscillator and return to low-power operation. The net effect is to limit temperature drift indefinitely, at the cost of slightly higher average power consumption resulting from the periodic operation of the high-speed crystal oscillator.

Although the foregoing example describes a device in which the RC oscillator circuit 22 is incorporated as part of a microcontroller, the oscillator circuit can be incorporated into other types of devices as well, including various integrated circuits, including, for example, radio frequency chips and memory chips.

Other implementations are within the scope of the claims.

What is claimed is:

1. A device comprising:
    an RC oscillator circuit operable to provide a tunable output frequency, the oscillator circuit including a bias circuit switchable between first and second modes of operation, one of which has less drift in oscillator bias current relative to the other mode;
    drift compensation circuitry operable to compensate for drift in the oscillator output frequency in a closed-loop mode of operation based on a comparison of the oscillator output frequency with a reference frequency; and
    a processor operable to compensate for temperature-based drift in the oscillator frequency in an open-loop mode of operation based on a measured temperature value in a vicinity of the oscillator circuit,
    wherein the bias circuit includes a proportional-to-absolute-temperature branch and a complementary-to-absolute-temperature branch, wherein in the first mode of operation, only the proportional-to-absolute-temperature branch is enabled, and wherein in the second mode of operation, both the proportional-to-absolute-temperature branch and the complementary-to-absolute-temperature branch are enabled.

2. The device of claim 1 wherein the second mode of operation results in less drift in the oscillator bias current relative to the first mode of operation.

3. A device comprising:
    an RC oscillator circuit operable to provide a tunable output frequency, the oscillator circuit including a bias circuit switchable between first and second modes of operation, one of which has less drift in oscillator bias current relative to the other mode;
    drift compensation circuitry operable to compensate for drift in the oscillator output frequency in a closed-loop mode of operation based on a comparison of the oscillator output frequency with a reference frequency; and
    a processor operable to compensate for temperature-based drift in the oscillator frequency in an open-loop mode of operation based on a measured temperature value in a vicinity of the oscillator circuit,
    wherein the RC oscillator circuit comprises a tunable capacitor and a tunable resistor, each of which is adjusted according to a respective input value, wherein during operation according to the closed-loop and open-loop modes, the input value for the tunable resistor is adjusted, respectively, by the drift compensation circuitry and by the processor.

4. The device of claim 3 wherein the drift compensation circuitry includes a comparator operable to compare an output frequency of the oscillator circuit with a reference frequency, wherein the drift compensation circuitry is operable to adjust the input value for the tunable resistor based on the comparison.

5. The device of claim 4 wherein the drift compensation circuitry is operable to detect that a value determined for the tunable resistor corresponds to a high or low extreme within a range of possible values and operable to generate an error signal to the processor if the high or low extreme is detected.

6. The device of claim 5 wherein the processor is operable to adjust the input value for the tunable capacitor in response to receiving the error signal.

7. The device of claim 6 wherein the processor is operable, after adjusting the input value for the tunable capacitor, to trigger the drift compensation circuitry to adjust the input value for the tunable resistor in the closed-loop mode of operation.

8. The device of claim 3 wherein the processor is operable in the open-loop mode of operation to determine an input value for the resistor using interpolation based on the measured temperature value in the vicinity of the oscillator circuit and based on a plurality of previously stored calibration values corresponding to a plurality of different temperatures.

9. The device of claim 3 wherein the processor is operable in the open-loop mode of operation to determine an input value for the resistor by extrapolation based on the measured temperature value in the vicinity of the oscillator circuit and based on a previously stored calibration value at a known temperature.

10. The device of claim 3 comprising one or more registers to store the respective input values for the capacitor and the resistor, wherein each of the input values takes the form of a multi-bit vector.

11. A method of operating an RC oscillator circuit that provides a tunable output frequency, the method comprising:
    providing a signal to the oscillator circuit to cause a bias circuit for the oscillator circuit to switch between first and second modes of operation, one of which has less drift in oscillator bias current relative to the other mode, wherein the bias circuit includes a proportional-to-absolute-temperature branch and a complemtary-to-absolute-temperature branch, the method including:
        enablnig only the proportional-to-absolute-temperature branch in the first mode of operation, and
        enabling both the proportional-to-absolute-temperature branch and the complementary-to-absolute-temperature branch in the second mode of operation, the method further including:
    generating a mode selection signal to enable one of the following modes of operation: a closed-loop mode of operation based to compensate for drift in the oscillator output frequency based on a comparison of the oscillator output frequency with a reference frequency or an open-loop mode of operation to compensate for temperature-based drift in the oscillator frequency based on a measured temperature value in a vicinity of the oscillator circuit.

12. The method of claim 11 wherein the second mode of operation results in less drift in the oscillator bias current relative to the first mode of operation.

13. The method of claim 11 wherein the RC oscillator circuit comprises a tunable capacitor and a tunable resistor, each of which is adjustable according to a respective input value, the method comprising adjusting the input value for the tunable resistor during operation in the closed-loop mode or the open-loop mode.

14. The method of claim 13 comprising:
comparing an output frequency of the oscillator circuit with a reference frequency during operation in the closed-loop mode, and
adjusting the input value for the tunable resistor based on the comparison.

15. The method of claim 14 comprising:
detecting that a value determined for the tunable resistor corresponds to a high or low extreme within a range of possible values; and
generating an error signal if the high or low extreme is detected.

16. The method of claim 15 comprising adjusting the input value for the tunable capacitor in response to receiving the error signal.

17. The method of claim 16 comprising triggering adjustment of the input value for the tunable resistor in the closed-loop mode of operation after adjusting the input value for the tunable capacitor.

18. The method of claim 13 comprising determining, in the open-loop mode of operation, an input value for the resistor using interpolation based on the measured temperature value in the vicinity of the oscillator circuit and based on a plurality of previously stored calibration values corresponding to a plurality of different temperatures.

19. The method of claim 13 comprising determining, in the open-loop mode of operation, an input value for the resistor using extrapolation based on the measured temperature value in the vicinity of the oscillator circuit and based on a previously stored calibration value at a known temperature.

20. An RC oscillator circuit operable to provide a tunable output frequency, the oscillator circuit comprising:
a tunable capacitor, and a resistor that is tunable independently of the capacitor; and
a bias circuit switchable between first and second modes of operation, one of which has less drift in oscillator bias current relative to the other mode,
wherein the bias circuit includes a proportional-to-absolute-temperature branch and a complementary-to-absolute-temperature branch, wherein in the first mode of operation, only the proportional-to-absolute-temperature branch is enabled, and wherein in the second mode of operation, both the proportional-to-absolute-temperature branch and the complementary-to-absolute-temperature branch are enabled.

21. The RC oscillator circuit of claim 20 wherein the second mode of operation results in less drift in the oscillator bias current relative to the first mode of operation.

22. A method of operating an RC oscillator circuit that provides a tunable output frequency, the method comprising:
comparing an output frequency of the oscillator circuit with a reference frequency;
adjusting an input value for a tunable resistor in the oscillator circuit based on the comparison;
detecting that the input value for the tunable resistor corresponds to a highest or lowest value within a specified range of possible values; and
generating an error signal if the highest or lowest value is detected.

* * * * *

UNITED STATES PATENT AND TRADEMARK OFFICE
CERTIFICATE OF CORRECTION

PATENT NO. : 8,497,741 B2
APPLICATION NO. : 13/271676
DATED : July 30, 2013
INVENTOR(S) : Frode Milch Pedersen et al.

It is certified that error appears in the above-identified patent and that said Letters Patent is hereby corrected as shown below:

In the Claims:

Column 8, Claim 11, Line 54: delete "complemtary" and insert --complementary--.

Column 8, Claim 11, Line 56: delete "enablnig" and insert --enabling--.

Signed and Sealed this
Fifth Day of November, 2013

Teresa Stanek Rea
*Deputy Director of the United States Patent and Trademark Office*